(12) United States Patent  
Morimoto

(10) Patent No.: US 7,372,281 B2
(45) Date of Patent: May 13, 2008

(54) CAPACITANCE TYPE SENSOR

(75) Inventor: Hideo Morimoto, Nara (JP)

(73) Assignee: Nitta Corporation, Osaka (JP)

( * ) Notice: Subject to any disclaimer, the term of this patent is extended or adjusted under 35 U.S.C. 154(b) by 41 days.

(21) Appl. No.: 11/436,364

(22) Filed: May 18, 2006

(65) Prior Publication Data

US 2006/0267598 A1    Nov. 30, 2006

(30) Foreign Application Priority Data

May 31, 2005    (JP) .............................. 2005-159183

(51) Int. Cl.
*G01R 27/26* (2006.01)
*G01L 1/00* (2006.01)

(52) U.S. Cl. .................... 324/661; 73/780; 73/862.043

(58) Field of Classification Search ................ 324/661, 324/658, 649, 600, 660, 662, 663, 671, 674, 324/678, 681, 686, 688, 765; 73/780, 862.043
See application file for complete search history.

(56) References Cited

U.S. PATENT DOCUMENTS 6,820,494 B2 * 11/2004 Morimoto .................... 73/780

6,867,601 B2 * 3/2005 Morimoto .................... 324/661
6,958,614 B2 * 10/2005 Morimoto .................... 324/661
2004/0080216 A1 * 4/2004 Morimoto .................... 307/125

FOREIGN PATENT DOCUMENTS

JP     2001-091382 A    4/2001

OTHER PUBLICATIONS

Patent Abstracts of Japan—Publication No. 2001-091382 dated Apr. 6, 2001 (2 pages).

* cited by examiner

*Primary Examiner*—Andrew H. Hirshfeld
*Assistant Examiner*—Hoai-An D. Nguyen
(74) *Attorney, Agent, or Firm*—Osha Liang LLP

(57) ABSTRACT

A displacement electrode cooperates with four switch electrodes on a substrate to form respective switches SW1 to SW4. When all of the switches SW1 to SW4 are on, no X- and Y-axial outputs are activated and only a Z-axial output is activated. On the other hand, when at least one of the switches SW1 to SW4 is off, no Z-axial output is activated and only X- and Y-axial outputs are activated.

8 Claims, 7 Drawing Sheets

CAPACITANCE TYPE SENSOR

BACKGROUND OF THE INVENTION

1. Field of the Invention

The present invention relates to a capacitance type sensor suitable for detecting a force externally applied.

2. Description of Related Art

A capacitance type sensor is generally used for converting into electrical signals the magnitude and direction of a force applied by an operator. For example, in an input device for a computer, a capacitance type sensor for inputting multi-dimensional operations is incorporated as a so-called joystick.

In the capacitance type sensor, an operation quantity having a predetermined dynamic range can be input as the magnitude of a force applied by the operator. In addition, such a capacitance type sensor is used also as a two- or three-dimensional sensor capable of resolving into each dimensional component an applied force to be detected. In particular, capacitance type sensors in which a capacitance element is formed between two electrodes to detect a force on the basis of a change in capacitance value caused by a change in the distance between the electrodes, have been put into practical use in various fields because they have a merit that the construction can be simplified to intend to reduce the cost.

For example, JP-A-2001-91382 discloses a capacitance type sensor in which fixed electrodes on the X-axis, fixed electrodes on the Y-axis, and a fixed electrode on the Z-axis surrounded by the X- and Y-axial fixed electrodes, cooperate with a movable electrode plate to form variable capacitance elements. In the capacitance type sensor, for example, when an X-axial force Fx is applied to an operation portion, the distance between a fixed electrode on the X-axis and the movable electrode plate is decreased to increase the capacitance value of the capacitance element formed by the electrodes. Therefore, by detecting the change in capacitance value of the capacitance element, an X-axial signal corresponding to the X-axial force Fx can be output.

In the capacitance type sensor, however, an X-axial signal corresponding to an X-axial force Fx, a Y-axial signal corresponding to a Y-axial force Fy, and a Z-axial signal corresponding to a Z-axial force Fz, are always output when any force is applied to the operation portion. Therefore, when only the X- or Y-axial output is intended to be changed, the Z-axial output may also change. On the other hand, when only the Z-axial output is intended to be changed, the X- or Y-axial output may also change.

For example, in the case that the capacitance type sensor is applied to a joystick for moving a cursor on the basis of X- and Y-axial outputs, and performing a predetermined operation such as clicking on the basis of a Z-axial output, the cursor is moved to a predetermined position, for example, on an icon, by changing the X- and Y-axial outputs, and then the predetermined operation is performed by changing the Z-axial output. In this case, however, when a force is applied for moving the cursor, the predetermined operation may be erroneously performed because not only the X- and Y-axial outputs but also the Z-axial output changes. On the other hand, when a force is applied for performing the predetermined operation, the cursor may be moved because not only the Z-axial output but also the X- and Y-axial outputs change. This makes it difficult to perform the predetermined operation with keeping the cursor at the predetermined position.

SUMMARY OF THE INVENTION

An object of the present invention is to provide a capacitance type sensor good in operability and less in erroneous operation.

According to an aspect of the present invention, a capacitance type sensor comprises a substrate; a detective member opposed to the substrate; a conductive member disposed between the substrate and the detective member so as to be displaceable together with the detective member perpendicularly to the substrate; a first capacitance electrode formed on the substrate so as to cooperate with the conductive member to form a first capacitance element; a second capacitance electrode formed on the substrate so as to cooperate with the conductive member to form a second capacitance element; a common electrode formed on the substrate, electrically connected to the conductive member, and kept at a ground potential or another fixed potential; and a plurality of switch electrodes formed on the substrate so as to be distant from the conductive member, and kept at a potential different from the ground potential. The conductive member can be displaced toward the first and second capacitance electrodes and come into contact with at least one of the plurality of switch electrodes when the detective member is displaced. When the conductive member is distant from at least one of the plurality of switch electrodes, the sensor can detect displacement of a portion of the detective member corresponding to the first capacitance electrode on the basis of detection of a change in capacitance value of the first capacitance element caused by a change in distance between the conductive member and the first capacitance electrode, by using only a signal being input to the first capacitance electrode. When the conductive member is in contact with all of the plurality of switch electrodes, the sensor can detect displacement of a portion of the detective member corresponding to the second capacitance electrode on the basis of detection of a change in capacitance value of the second capacitance element caused by a change in distance between the conductive member and the second capacitance electrode, by using only a signal being input to the second capacitance electrode.

According to the aspect of the above paragraph, when the conductive member is distant from at least one of the plurality of switch electrodes, the sensor can detect displacement of the portion of the detective member corresponding to the first capacitance electrode by using only the signal being input to the first capacitance electrode. On the other hand, when the conductive member is in contact with all of the plurality of switch electrodes, the sensor can detect displacement of the portion of the detective member corresponding to the second capacitance electrode by using only the signal being input to the second capacitance electrode. In short, the sensor can detect the displacements of the different portions of the detective member in accordance with conditions of contact of the conductive member with the plurality of switch electrodes. Thus, an output based on the first capacitance electrode and an output based on the second capacitance electrode can be obtained exclusively for each other. As a result, the operability is improved and erroneous operations decreases.

According to another aspect of the present invention, a capacitance type sensor comprises a substrate that defines thereon an XY plane; a detective member opposed to the substrate; a conductive member disposed between the substrate and the detective member so as to be displaceable together with the detective member along a Z-axis perpendicular to the substrate; an X-axial electrode formed on an X-axis on the substrate so as to cooperate with the conductive member to form a first capacitance element; a Y-axial electrode formed on a Y-axis on the substrate so as to cooperate with the conductive member to form a second capacitance element; a Z-axial electrode formed at an origin on the substrate so as to cooperate with the conductive member to form a third capacitance element; a common electrode formed on the substrate, electrically connected to the conductive member, and kept at a ground potential or another fixed potential; and a plurality of switch electrodes formed on the substrate so as to be distant from the conductive member, and kept at a potential different from the ground potential. The conductive member can be displaced toward the first to third capacitance electrodes and come into contact with at least one of the plurality of switch electrodes when the detective member is displaced. When the conductive member is distant from at least one of the plurality of switch electrodes, the sensor can detect displacement of a portion of the detective member corresponding to an X-axial direction on the basis of detection of a change in capacitance value of the first capacitance element caused by a change in distance between the conductive member and the X-axial electrode, by using only a signal being input to the X-axial electrode; and detect displacement of a portion of the detective member corresponding to a Y-axial direction on the basis of detection of a change in capacitance value of the second capacitance element caused by a change in distance between the conductive member and the Y-axial electrode, by using only a signal being input to the Y-axial electrode. When the conductive member is in contact with all of the plurality of switch electrodes, the sensor can detect displacement of a portion of the detective member corresponding to a Z-axial direction on the basis of detection of a change in capacitance value of the third capacitance element caused by a change in distance between the conductive member and the Z-axial electrode, by using only a signal being input to the Z-axial electrode.

According to the aspect of the above paragraph, when the conductive member is distant from at least one of the plurality of switch electrodes, the sensor can detect displacement of the portion of the detective member corresponding to the X-axial direction by using only the signal being input to the X-axial electrode; and detect displacement of the portion of the detective member corresponding to the Y-axial direction by using only the signal being input to the Y-axial electrode. On the other hand, when the conductive member is in contact with all of the plurality of switch electrodes, the sensor can detect displacement of the portion of the detective member corresponding to the Z-axial direction by using only the signal being input to the Z-axial electrode. In short, the sensor can detect the displacements of the different portions of the detective member in accordance with conditions of contact of the conductive member with the plurality of switch electrodes. Thus, outputs based on the X- and Y-axial electrodes and an output based on the Z-axial electrode can be obtained exclusively for each other. As a result, the operability is improved and erroneous operations decreases.

According to still another aspect of the present invention, the sensor comprises a pair of X-axial electrodes disposed so as to be X-axially distant from each other and symmetrical with respect to the Y-axis; and a pair of Y-axial electrodes disposed so as to be Y-axially distant from each other and symmetrical with respect to the X-axis.

According to the aspect of the above paragraph, X- and Y-axial forces can be accurately detected.

According to still another aspect of the present invention, a capacitance type sensor comprises a substrate; a detective member opposed to the substrate; a conductive member disposed between the substrate and the detective member so as to be displaceable together with the detective member perpendicularly to the substrate; a first capacitance electrode formed on the substrate so as to cooperate with the conductive member to form a first capacitance element; a second capacitance electrode formed on the substrate so as to cooperate with the conductive member to form a second capacitance element; a common electrode formed on the substrate, electrically connected to the conductive member, and kept at a ground potential or another fixed potential; and a plurality of switch electrodes formed on the substrate so as to be distant from the conductive member, and kept at a potential different from the ground potential. The conductive member can be displaced toward the first and second capacitance electrodes and come into contact with at least one of the plurality of switch electrodes when the detective member is displaced. When the conductive member is distant from any of the plurality of switch electrodes, the sensor can detect displacement of a portion of the detective member corresponding to the first capacitance electrode on the basis of detection of a change in capacitance value of the first capacitance element caused by a change in distance between the conductive member and the first capacitance electrode, by using only a signal being input to the first capacitance electrode. When the conductive member is in contact with at least one of the plurality of switch electrodes, the sensor can detect displacement of a portion of the detective member corresponding to the second capacitance electrode on the basis of detection of a change in capacitance value of the second capacitance element caused by a change in distance between the conductive member and the second capacitance electrode, by using only a signal being input to the second capacitance electrode.

According to the aspect of the above paragraph, when the conductive member is distant from any of the plurality of switch electrodes, the sensor can detect displacement of the portion of the detective member corresponding to the first capacitance electrode by using only the signal being input to the first capacitance electrode. On the other hand, when the conductive member is in contact with at least one of the plurality of switch electrodes, the sensor can detect displacement of the portion of the detective member corresponding to the second capacitance electrode by using only the signal being input to the second capacitance electrode. In short, the sensor can detect the displacements of the different portions of the detective member in accordance with conditions of contact of the conductive member with the plurality of switch electrodes. Thus, an output based on the first capacitance electrode and an output based on the second capacitance electrode can be obtained exclusively for each other. As a result, the operability is improved and erroneous operations decreases.

According to still another aspect of the present invention, a capacitance type sensor comprises a substrate that defines thereon an XY plane; a detective member opposed to the substrate; a conductive member disposed between the substrate and the detective member so as to be displaceable together with the detective member along a Z-axis perpendicular to the substrate; an X-axial electrode formed on an X-axis on the substrate so as to cooperate with the conductive member to form a first capacitance element; a Y-axial electrode formed on a Y-axis on the substrate so as to cooperate with the conductive member to form a second capacitance element; a Z-axial electrode formed at an origin on the substrate so as to cooperate with the conductive member to form a third capacitance element; a common electrode formed on the substrate, electrically connected to the conductive member, and kept at a ground potential or another fixed potential; and a plurality of switch electrodes formed on the substrate so as to be distant from the conductive member, and kept at a potential different from the ground potential. The conductive member can be displaced toward the first to third capacitance electrodes and come into contact with at least one of the plurality of switch electrodes when the detective member is displaced. When the conductive member is distant from any of the plurality of switch electrodes, the sensor can detect displacement of a portion of the detective member corresponding to an X-axial direction on the basis of detection of a change in capacitance value of the first capacitance element caused by a change in distance between the conductive member and the X-axial electrode, by using only a signal being input to the X-axial electrode; and detect displacement of a portion of the detective member corresponding to a Y-axial direction on the basis of detection of a change in capacitance value of the second capacitance element caused by a change in distance between the conductive member and the Y-axial electrode, by using only a signal being input to the Y-axial electrode. When the conductive member is in contact with at least one of the plurality of switch electrodes, the sensor can detect displacement of a portion of the detective member corresponding to a Z-axial direction on the basis of detection of a change in capacitance value of the third capacitance element caused by a change in distance between the conductive member and the Z-axial electrode, by using only a signal being input to the Z-axial electrode.

According to the aspect of the above paragraph, when the conductive member is distant from any of the plurality of switch electrodes, the sensor can detect displacement of the portion of the detective member corresponding to the X-axial direction by using only the signal being input to the X-axial electrode; and detect displacement of the portion of the detective member corresponding to the Y-axial direction by using only the signal being input to the Y-axial electrode. On the other hand, when the conductive member is in contact with at least one of the plurality of switch electrodes, the sensor can detect displacement of the portion of the detective member corresponding to the Z-axial direction by using only the signal being input to the Z-axial electrode. In short, the sensor can detect the displacements of the different portions of the detective member in accordance with conditions of contact of the conductive member with the plurality of switch electrodes. Thus, outputs based on the X- and Y-axial electrodes and an output based on the Z-axial electrode can be obtained exclusively for each other. As a result, the operability is improved and erroneous operations decreases.

According to still another aspect of the present invention, the sensor comprises a pair of X-axial electrodes disposed so as to be X-axially distant from each other and symmetrical with respect to the Y-axis; and a pair of Y-axial electrodes disposed so as to be Y-axially distant from each other and symmetrical with respect to the X-axis.

According to the aspect of the above paragraph, X- and Y-axial forces can be accurately detected.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

Hereinafter, preferred embodiments of the present invention will be described with reference to drawings. In the embodiments as will be described below, a capacitance type sensor of the present invention is applied to a joystick, as a pointing device, connected to a display unit of a personal computer system, a car navigation system, or the like.

Figure 1:
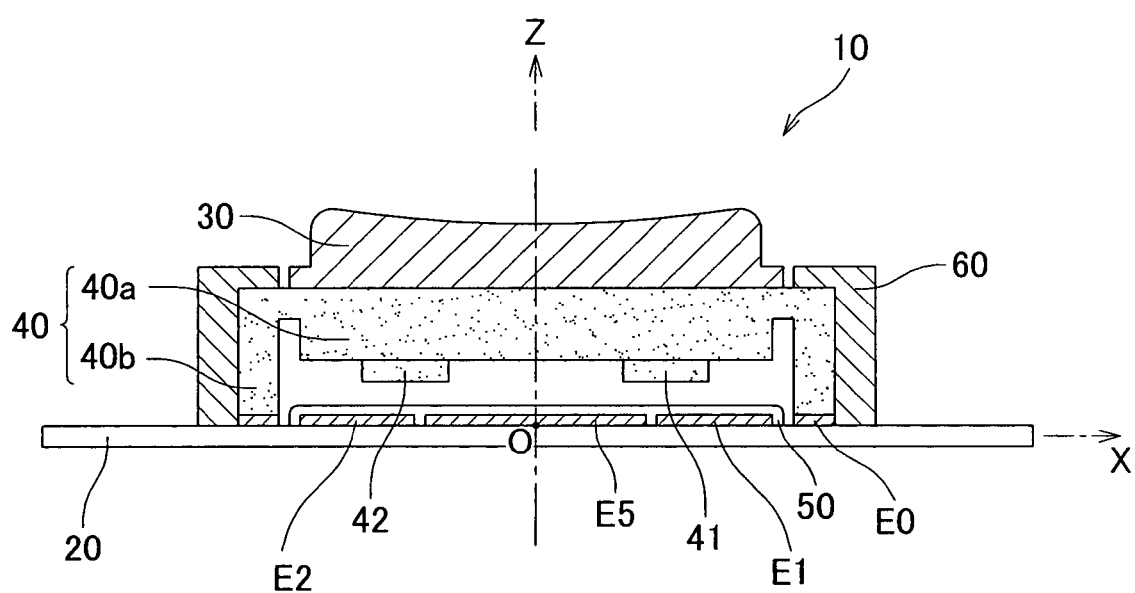
FIG. 1 is a schematic sectional view of a capacitance type sensor according to a first embodiment of the present invention.
Figure 2:
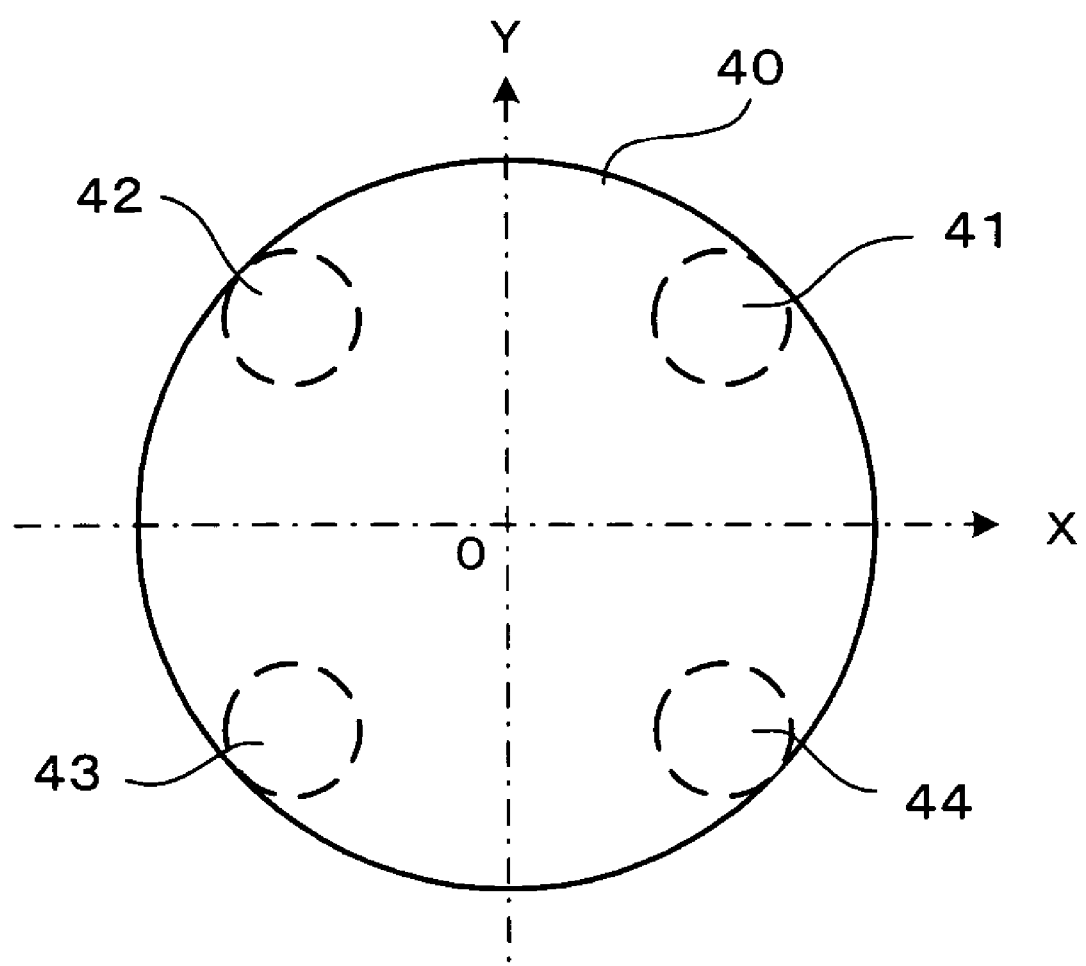
FIG. 2 is an upper view of a displacement electrode of the capacitance type sensor of FIG. 1.
Figure 3:
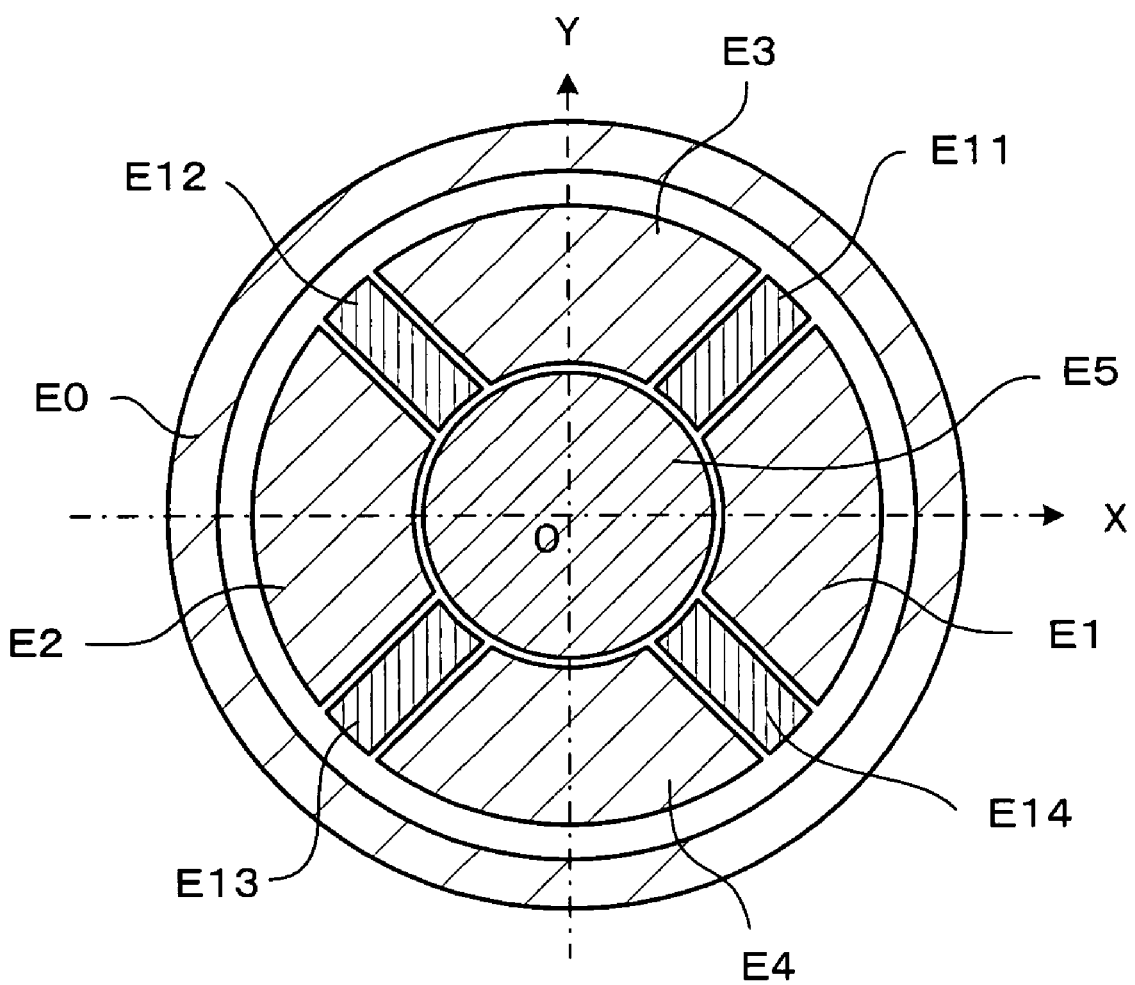
FIG. 3 is a view showing an arrangement of a plurality of electrodes formed on a substrate of the capacitance type sensor of FIG. 1.

FIG. 1 is a schematic sectional view of a capacitance type sensor according to a first embodiment of the present invention. FIG. 2 is an upper view of a displacement electrode of the capacitance type sensor of FIG. 1. FIG. 3 is a view showing an arrangement of a plurality of electrodes formed on a substrate of the capacitance type sensor of FIG. 1.

The capacitance type sensor 10 includes a substrate 20; a detective member 30; a displacement electrode 40; capacitance electrodes E1 to E5 though FIG. 1 shows only E1, E2, and E5; switch electrodes E11 to E14 as shown in FIG. 3; a common electrode E0; an insulating film 50; and a supporting member 60. The detective member 30 is to be operated by a human or the like, and thereby an external force is applied to the detective member 30. The capacitance electrodes E1 to E5 are formed on the substrate 20. The insulating film 50 is formed so as to be in close contact with the capacitance electrodes E1 to E5 and the switch electrodes E11 to E14 and cover the corresponding part of the upper surface of the substrate 20. The supporting member 60 is disposed so as to overlap a circumferential portion of the displacement electrode 40 and thereby support the displacement electrode 40 onto the substrate 20.

In this example, an XYZ three-dimensional coordinate system is defined as shown in FIGS. 1 to 3 for convenience of explanation, and the arrangement of components will be explained with reference to the coordinate system. More specifically, in FIG. 1, the origin O is defined on the substrate 20 at the center of the capacitance electrode E5; the X-axis is defined so as to extend horizontally rightward; the Z-axis is defined so as to extend vertically upward; and the Y-axis is defined so as to extend backward perpendicularly to FIG. 1. Thus, the upper surface of the substrate 20 is on the XY plane. The Z-axis extends through the respective center of the capacitance electrode E5 on the substrate 20, the detective member 30, and the displacement electrode 40.

The substrate 20 is made of a general printed circuit board for an electronic circuit. In this embodiment, a glass epoxy substrate is used as the substrate 20. In a modification, a film substrate made of, for example, a polyimide film, may be used. In the modification, however, because the film substrate is flexible, it is preferably used by being disposed on a support base sufficient in rigidity.

The detective member 30 is fixed on the upper surface of the displacement electrode 40. The detective member 30 is disk-shaped as a whole. In this embodiment, the diameter of the detective member 30 is substantially equal to the diameter of a circle made by connecting the outermost curves of the respective capacitance electrodes E1 to E4. Marks for indicating directions of operation, that is, directions of movement of a cursor, are formed on the upper surface of the detective member 30 so as to correspond to the respective positive and negative directions of the X- and Y-axes, that is, to correspond to the respective capacitance electrodes E1 to E4.

The displacement electrode 40 is made up of a disk-shaped displacement portion 40a and a fixed portion 40b disposed around the displacement portion 40a. The displacement portion 40a has its diameter substantially equal to the diameter of the circle made by connecting the outermost curves of the respective capacitance electrodes E1 to E4. The fixed portion 40b supports the displacement portion 40a to the substrate 20, and electrically connects the displacement portion 40a to the common electrode E0. In this embodiment, the common electrode E0 is kept at a ground (GND) potential. Thus, the displacement electrode 40 is also kept at the GND potential. This brings about a shield effect of preventing an erroneous operation caused by external noise, because the whole of the device is shielded by the GND potential. In a modification, the common electrode E0 may be kept at another constant potential than the GND potential.

As shown in FIG. 2, five protrusions 41 to 44 circular in cross section are formed on the lower surface of the displacement portion 40a of the displacement electrode 40. The protrusion 41 is disposed on the lower surface of the displacement portion 40a of the displacement electrode 40 at a position at an angle of 45 degrees from the respective positive portions of the X- and Y-axes. The protrusion 42 is disposed symmetrically to the protrusion 41 with respect to the positive portion of the Y-axis. The protrusion 43 is disposed symmetrically to the protrusion 41 with respect to the origin O. The protrusion 44 is disposed symmetrically to the protrusion 41 with respect to the positive portion of the X-axis. The displacement electrode 40 is made of conductive silicone rubber, and has elasticity. Thus, when a Z-axial negative force is applied to the detective member 30, the displacement portion 40a of the displacement electrode 40 is displaced in the Z-axial negative direction together with the detective member 30. In a modification, the protrusions 41 to 44 may not be provided on the displacement electrode 40.

Figure 4:
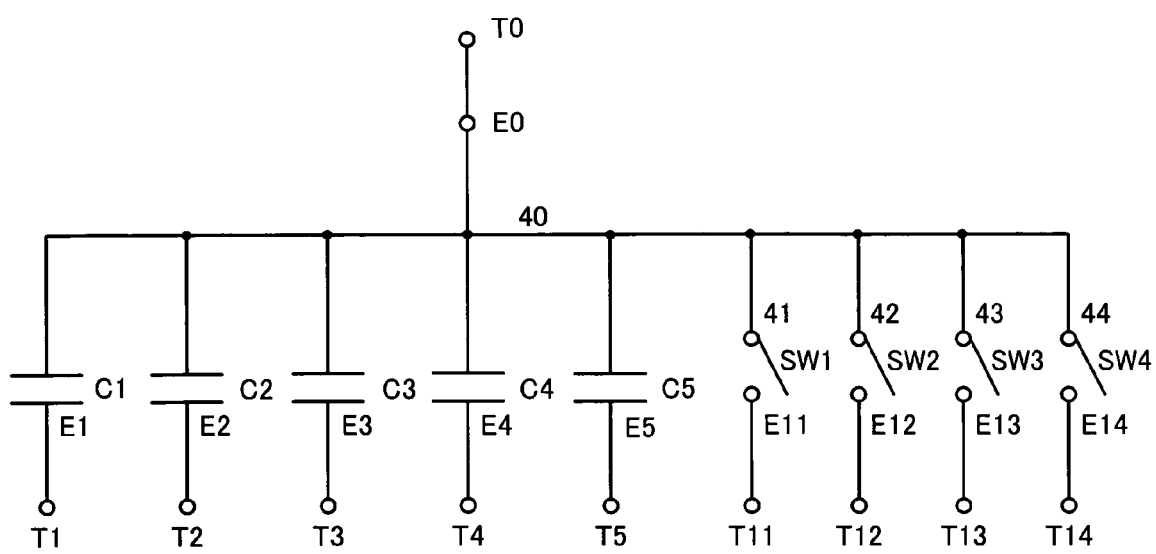
FIG. 4 is a diagram showing a circuit construction of the capacitance type sensor of FIG. 1.

As shown in FIG. 3, on the substrate 20, there are formed a circular capacitance electrode E5 having its center at the origin O; substantially fan-shaped capacitance electrodes E1 to E4 and substantially rectangular switch electrodes E11 to E14 arranged around the capacitance electrode E5; and an annular common electrode E0 disposed around the capacitance electrodes E1 to E4 and switch electrodes E11 to E14. The capacitance electrodes E1 to E5, the switch electrodes E11 to E14, and the common electrode E0, are connected through through-holes or the like to respective terminals T1 to T5, T11 to T14, and T0, as shown in FIG. 4. The terminals can be connected to an electronic circuit.

A pair of capacitance electrodes E1 and E2 are X-axially distant from each other so as to be symmetrical with respect to the Y-axis. A pair of capacitance electrodes E3 and E4 are Y-axially distant from each other so as to be symmetrical with respect to the X-axis. In this embodiment, the capacitance electrode E1 is disposed so as to correspond to the X-axial positive direction, and the capacitance electrode E2 is disposed so as to correspond to the X-axial negative direction. Thus, these electrodes are used for detecting the X-axial component of an external force. On the other hand, the capacitance electrode E3 is disposed so as to correspond to the Y-axial positive direction, and the capacitance electrode E4 is disposed so as to correspond to the Y-axial negative direction. Thus, these electrodes are used for detecting the Y-axial component of the external force.

The switch electrodes E11 to E14 are disposed in the respective intervals between the capacitance electrodes E1 to E4. The switch electrodes E11 to E14 are kept at a predetermined potential different from the ground potential. The switch electrodes E11 to E14 are opposed to the respective protrusions 41 to 44 of the displacement electrode 40.

The insulating film 50, which is an insulating resist film in this embodiment, is formed so as to be in close contact with the capacitance electrodes E1 to E5 on the substrate 20 and cover the electrodes. Therefore, the capacitance electrodes E1 to E5, each made of a copper foil or the like, are not exposed to air. Thus, the insulating film 50 prevents the capacitance electrodes E1 to E5 from being oxidized. In addition, because of the provision of the insulating film 50, the displacement electrode 40 is never put into direct contact with the capacitance electrodes E1 to E5. For preventing rust and oxidation, the surface of each of the common electrode E0 and the switch electrodes E11 to E14 may be plated with gold, or coated with a conductive film such as solder.

In the case of applying the capacitance type sensor 10 to a joystick, the size, material, and hardness of the displacement electrode 40, the shape of the detective member 30, and each size of the capacitance electrodes E1 to E5, are preferably set to the respective optimum values because those conditions influence the operational feeling.

Figure 5:
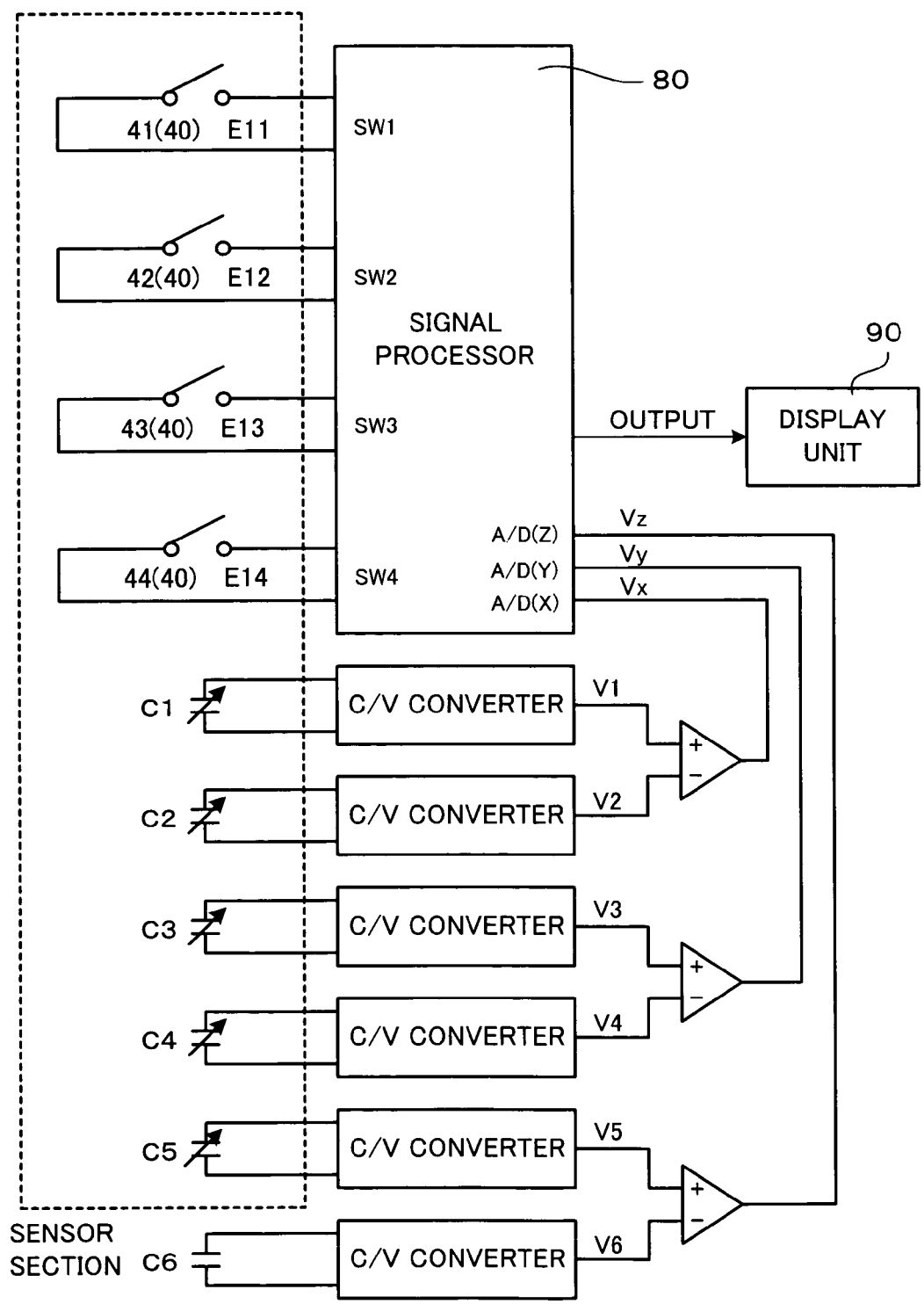
FIG. 5 is a block diagram showing a circuit construction of the capacitance type sensor of FIG. 1.

Next, circuit constructions of the capacitance type sensor 10 of this embodiment will be described with reference to FIGS. 4 and 5. FIGS. 4 and 5 are circuit diagrams showing circuit constructions of the capacitance type sensor shown in FIG. 1. In FIG. 5, a portion of the capacitance type sensor 10 corresponding to the above-described mechanical construction, is enclosed with a broken line. The outside of the broken line corresponds to an electronic circuit. In FIG. 4, the references T1 to T5, T11 to T14, and T0 denote terminals connected through through-holes or the like to the capacitance electrodes E1 to E5, the switch electrodes E11 to E14, and the common electrode E0, respectively.

Because the displacement electrode 40 is kept distant from the respective capacitance electrodes E1 to E5 with being opposed parallel to the respective capacitance electrodes E1 to E5, the displacement electrode 40 cooperates with the respective capacitance electrodes E1 to E5 to form capacitance elements C1 to C5. Each of the capacitance elements C1 to C5 is a variable capacitance element whose capacitance value changes in accordance with displacement of the displacement electrode 40. The displacement electrode 40 is connected to the common electrode E0, which is grounded through the terminal T0. Therefore, by applying cyclic signals to the respective terminals T1 to T5, five capacitance elements C1 to C5 can be electrically charged.

Voltage signals V1 and V2 converted by C/V converters connected to the respective capacitance elements C1 and C2, are read by, for example, an exclusive OR circuit, to obtain an output Vx. Likewise, voltage signals V3 and V4 converted by C/V converters connected to the respective capacitance elements C3 and C4, are read by, for example, an exclusive OR circuit, to obtain an output Vy; and voltage signals V5 and V6 converted by C/V converters connected to the respective capacitance elements C5 and C6, are read by, for example, an exclusive OR circuit, to obtain an output Vz. The capacitance element C6 shown in FIG. 5 is formed on the lower surface of the substrate 20 so as to always have a fixed capacitance value. The outputs Vx, Vy, and Vz thus obtained are input to respective A/D converter ports A/D(X), A/D(Y), and A/D(Z) of a signal processor 80, in which outputs as analogue voltages can be obtained that correspond to the respective X-, Y-, and Z-axial components of an external force applied to the detective member, on the basis of the capacitance values of the respective capacitance elements C1 to C6 having changed in accordance with the direction and magnitude of the external force. The signal processor 80 is actualized by a micro computer system or a computer system.

Each of the protrusions 41 to 44 of the displacement electrode 40 can selectively take a position where the protrusion is in contact with the corresponding one of the switch electrodes E11 to E14, and a position where the protrusion is distant from the corresponding switch electrode. Thus, the displacement electrode 40 cooperates with the respective switch electrodes E11 to E14 to form switches SW1 to SW4. ON/OFF signals of the switches SW1 to SW4 are input to the signal processor 80, and thereby the signal processor 80 can generate therein four switch signals. The signal processor 80 outputs signals, such as a cursor movement signal, to a display unit 90 connected to the capacitance type sensor 10.

For example, when a portion of the detective member 30 corresponding to the X-axial positive direction is pressed downward, the protrusions 41 and 44 of the displacement electrode 40 are brought into contact with the respective switch electrodes E11 and E14 on the substrate 20 to turn the switches SW1 and SW4 on. The case is similar wherein a portion of the detective member 30 corresponding to the X-axial negative direction, the Y-axial positive direction, or the Y-axial negative direction, is pressed downward. Thus, when a portion of the detective member 30 corresponding to one of the X-axial positive direction, the X-axial negative direction, the Y-axial positive direction, and the Y-axial negative direction, is pressed downward, the displacement electrode 40 is inclined to turn one of the switches SW1 to SW4 on. At this time, in accordance with the direction and magnitude of the force applied to the detective member 30, there may be a case wherein two or three of the switches SW1 to SW4 are turned on. However, there is scarcely a case wherein all of the switches SW1 to SW4 are turned on. Contrastingly, when a portion near the center of the detective member 30 is pressed downward, that is, when the detective member 30 is pressed downward with being kept horizontal, all of the switches SW1 to SW4 are turned on.

Figure 6:
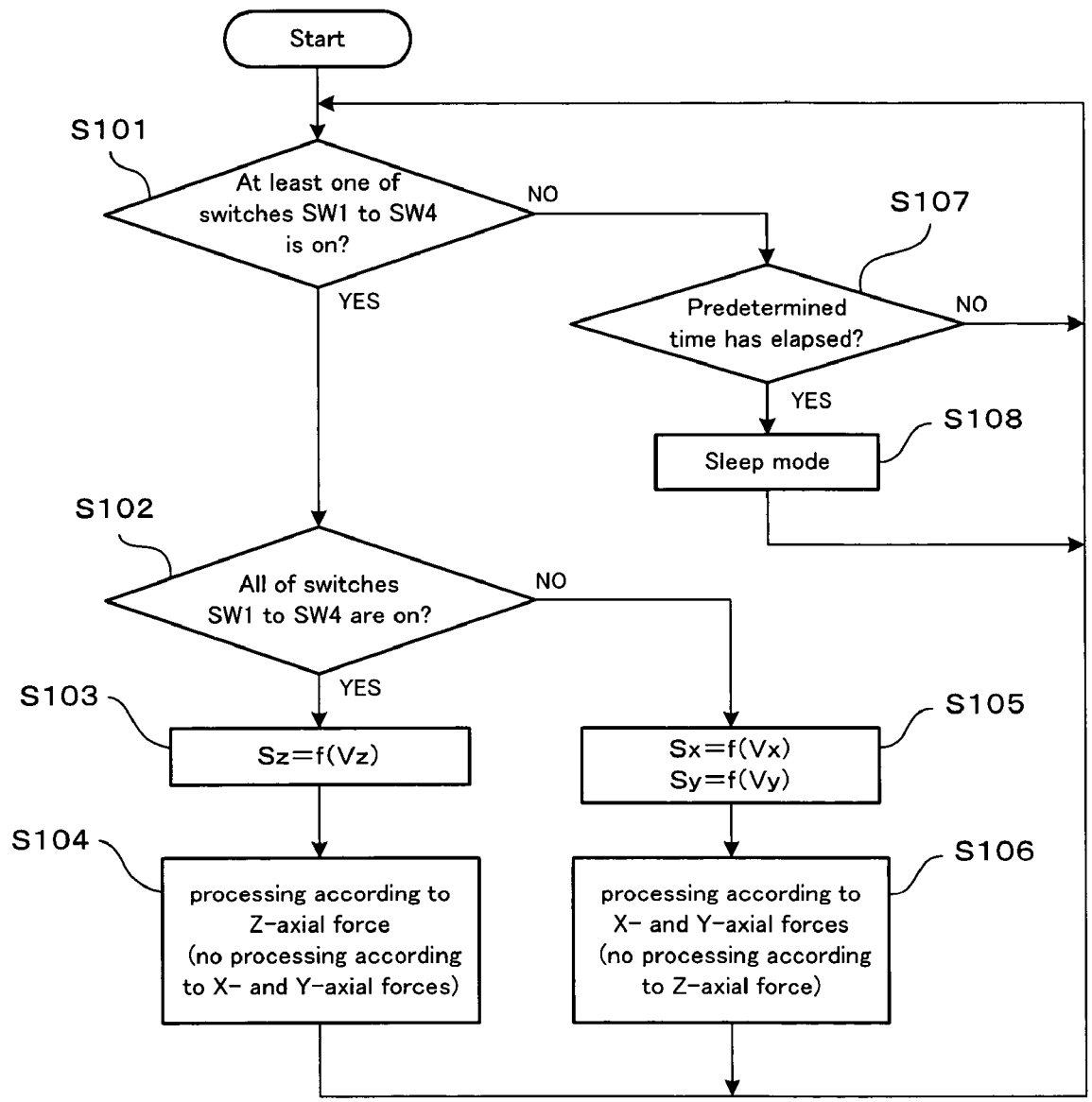
FIG. 6 is a flowchart showing a procedure in a signal processor of the capacitance type sensor of FIG. 1.

Next, a procedure in the signal processor 80 of the capacitance type sensor 10 will be described with reference to FIG. 6. FIG. 6 is a flowchart showing a procedure in the signal processor of the capacitance type sensor.

In Step S101, it is judged whether or not at least one of the switches SW1 to SW4 is on. When at least one of the switches SW1 to SW4 is on, the following calculations are performed using the voltage signals V1 to V6 converted by the C/V converters connected to the respective capacitance elements C1 to C6:

Vx=V1-V2
Vy=V3-V4
Vz=V5-V6

The above calculations may be carried out by using a micro computer or the like after the voltage signals are converted into digital signals by A/D converters or the like; or may be carried out by using operation (OP) amplifiers. Otherwise, bridge circuits may be constructed to directly output the results of the calculations. Further, the voltage signals V1 to V6 converted by the C/V converters may be directly input to the A/D converter ports A/D(X), A/D(Y), and A/D(Z) of the signal processor 80 to obtain the above Vx, Vy, and Vz by calculation in the signal processor 80.

In Step S102, it is judged whether or not all of the switches SW1 to SW4 are on. When all of the switches SW1 to SW4 are on, the signal Vz obtained by the above calculations is converted into an appropriate output signal Sz, in Step S103. The output signal Sz is output to a display unit of a personal computer system or a car navigation system, in which processing is performed according to the Z-axial force, in Step S104. In this case, because output signals Sx and Sy obtained by conversion from the respective signals Vx and Vy indicate that the operation button 10 is not operated X- and Y-axially, processing according to X- and Y-axial forces is not performed.

On the other hand, when some of the switches SW1 to SW4 are off, the signals Vx and Vy obtained by the above calculations are converted into appropriate output signals Sx and Sy, in Step S105. The output signals Sx and Sy are output to the display unit of the personal computer system or the car navigation system, in which processing is performed according to the X- and Y-axial forces, in Step S106. In this case, because the output signal Sz obtained by conversion from the signal Vz indicates that the operation button 10 is not operated Z-axially, processing according to Z-axial force is not performed.

As described above, when all of the switches SW1 to SW4 are on, processing based on the output signals Sx and Sy is not performed and processing based on the output signal Sz is only performed. On the other hand, when some of the switches SW1 to SW4 are off, processing based on the output signal Sz is not performed and processing based on the output signals Sx and Sy is only performed.

When any of the switches SW1 to SW4 is off as the result of the judgment of Step S101, it is then judged in Step S107 whether or not a predetermined time has elapsed. When it is decided that the predetermined time has elapsed, the operation mode is changed from a normal mode into a sleep mode so that the system is put into a power-saving state, in Step S108. Afterward, when it is detected that at least one of the switches SW1 to SW4 has been turned on, the operation mode is changed into the normal mode.

As described above, in the case of applying the capacitance type sensor 10 of this embodiment to a joystick as a pointing device, the following control is possible. For example, the X and Y outputs are used to move a cursor to an objective point on a map display unit of a car navigation system. When the detective member 30 is Z-axially depressed, the map being displayed is enlarged in accordance with a change in the Z-axial output. If the Z-axial output exceeds a certain threshold, the enlargement of the map is fixed even after the Z-axial depression is stopped. Afterward, when the operation button 10 is again Z-axially depressed and the Z-axial output exceeds the threshold, the fixation of the scale is reset and the map is scaled up/down to restore the map into the original scale. In this case, it is preferable that the operator can be informed by a sound or the like when the Z-axial output exceeds the threshold. Thus, because moving the cursor according to the X and Y outputs and scaling the map being displayed according to the Z-axial output can be performed independently of each other, no erroneous operation occurs and this makes the system easy to use.

Figure 7:
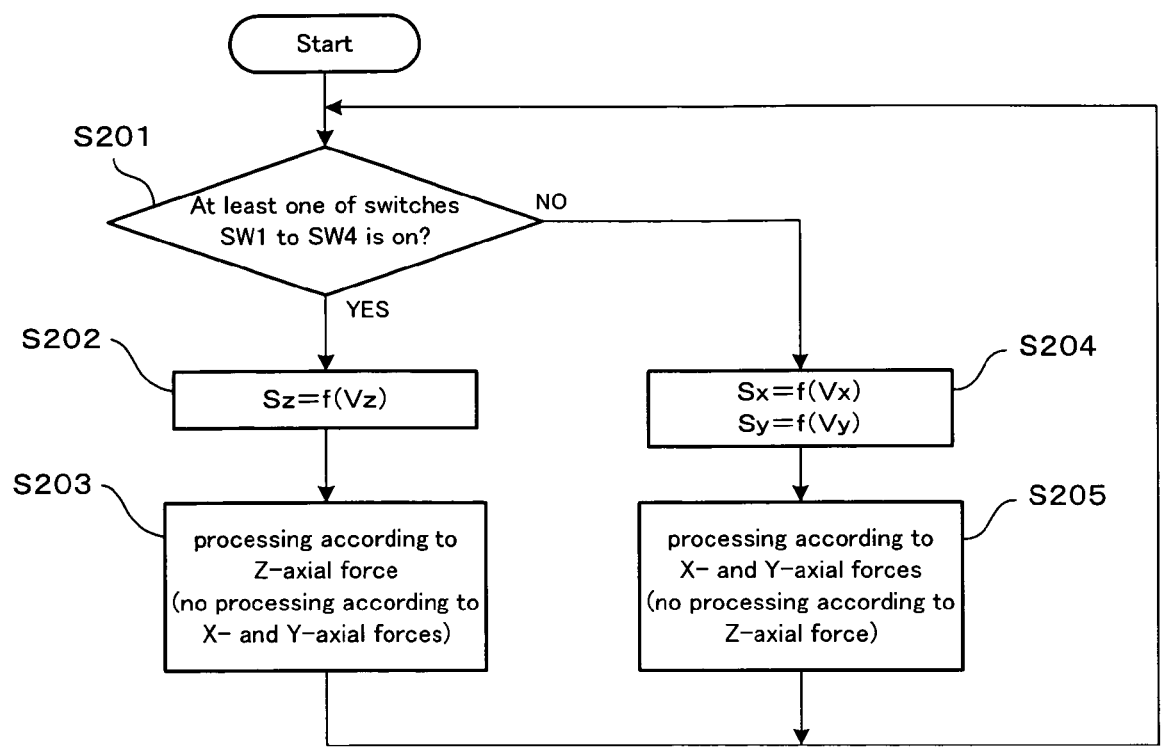
FIG. 7 is a flowchart showing a procedure in a signal processor of a capacitance type sensor according to a second embodiment of the present invention.

Next, a capacitance type sensor according to a second embodiment of the present invention will be described. The capacitance type sensor of the second embodiment differs from the capacitance type sensor 10 of the first embodiment in the procedure of the signal processor. FIG. 7 is a flowchart showing a procedure in the signal processor of the capacitance type sensor according to the second embodiment of the present invention. The capacitance type sensor of the second embodiment has substantially the same construction as the capacitance type sensor 10 of the first embodiment, and thus the detailed description of the construction will be omitted.

A procedure in the signal processor of the capacitance type sensor of this embodiment will be described with reference to FIG. 7.

In Step S201, it is judged whether or not at least one of the switches SW1 to SW4 is on. When at least one of the switches SW1 to SW4 is on, the following calculations are performed using the voltage signals V1 to V6 converted by the C/V converters connected to the respective capacitance elements C1 to C6:

$Vx=V1-V2$
$Vy=V3-V4$
$Vz=V5-V6$

In Step S202, the signal Vz obtained by the above calculations is converted into an appropriate output signal Sz. The output signal Sz is output to a display unit of a personal computer system or a car navigation system, in which processing is performed according to the Z-axial force, in Step S203. In this case, because output signals Sx and Sy obtained by conversion from the respective signals Vx and Vy indicate that the operation button 10 is not operated X- and Y-axially, processing according to X- and Y-axial forces is not performed.

On the other hand, when any of the switches SW1 to SW4 is off, the signals Vx and Vy obtained by the above calculations are converted into appropriate output signals Sx and Sy, in Step S204. The output signals Sx and Sy are output to the display unit of the personal computer system or the car navigation system, in which processing is performed according to the X- and Y-axial forces, in Step S205. In this case, because the output signal Sz obtained by conversion from the signal Vz indicates that the operation button 10 is not operated Z-axially, processing according to Z-axial force is not performed.

As described above, when at least one of the switches SW1 to SW4 is on, processing based on the output signals Sx and Sy is not performed and processing based on the output signal Sz is only performed. On the other hand, when any of the switches SW1 to SW4 is off, processing based on the output signal Sz is not performed and processing based on the output signals Sx and Sy is only performed.

Thus, the capacitance type sensor of this embodiment can bring about the same effect as the capacitance type sensor 10 of the first embodiment. In addition, in the capacitance type sensor of this embodiment, the Z-axial sensitivity is improved in comparison with the capacitance type sensor 10 of the first embodiment. Therefore, the capacitance type sensor of this embodiment is effective particularly in a case wherein control of the Z-axial output in a state that all of the switches SW1 to SW4 are on, is difficult because of, for example, a dimensional relation in the mechanism of the sensor, the sense and habit of an operator, and so on.

The preferred embodiments of the present invention have been described. However, the present invention is never limited to the above-described embodiments. For example, in the above-described embodiments, 3-axial outputs of the X-, Y-, and Z-axial outputs are obtained. In a modification, however, only 2-axial outputs of the X- and Z-axial outputs may be obtained. In another modification, only 2-axial outputs of the Y- and Z-axial outputs may be obtained.

In the above-described embodiments, the displacement electrode 40 is formed into a separate member from the supporting member 60. In a modification, however, the displacement electrode 40 may be formed integrally with the supporting member 60. In a modification, the displacement electrode 40 may be made of not conductive silicone rubber but non-conductive silicone rubber coated with conductive ink or paint; non-conductive silicone rubber coated with a conductive metallic film formed by vapor deposition or sputtering; a conductive thermoplastic resin such as PPT or elastomer; or conductive plastic. In short, the displacement electrode 40 may be made of a flexible conductive member or a flexible non-conductive member coated with a conductive material. In a modification, the supporting member 60 may be made of not silicone rubber but a resin film or a thin metal.

In the above-described embodiments, the switch outputs of the respective switches SW1 to SW4 are used only for controlling the capacitance type sensor of the invention. In a modification, however, the switch outputs of the respective switches SW1 to SW4 may be used also for another control.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A capacitance type sensor comprising:
   a substrate that defines thereon an XY plane;
   a detective member opposed to the substrate;
   a conductive member disposed between the substrate and the detective member so as to be displaceable together with the detective member along a Z-axis that is perpendicular to the substrate;
   a first capacitance electrode formed on the substrate so as to cooperate with the conductive member to form a first capacitance element;
   a second capacitance electrode formed on the substrate so as to cooperate with the conductive member to form a second capacitance element;
   a common electrode formed on the substrate, electrically connected to the conductive member, and kept at a ground potential or another fixed potential; and
   a plurality of switch electrodes formed on the substrate so as to be distant from the conductive member, and kept at a potential different from the ground potential,
   the conductive member being able to be displaced toward the first and second capacitance electrodes and come into contact with at least one of the plurality of switch electrodes when the detective member is displaced, the sensor being able to detect displacement of a portion of the detective member corresponding to a first direction in the XY plane on the basis of detection of a change in capacitance value of the first capacitance element caused by a change in distance between the conductive member and the first capacitance electrode, by using only a signal being input to the first capacitance electrode, when the conductive member is distant from at least one of the plurality of switch electrodes, and the sensor being able to detect displacement of a portion of the detective member corresponding to a direction on the Z-axis on the basis of detection of a change in capacitance value of the second capacitance element caused by a change in distance between the conductive member and the second capacitance electrode, by using only a signal being input to the second capacitance electrode, when the conductive member is in contact with all of the plurality of switch electrodes.

2. The sensor according to claim 1, wherein the first capacitance electrode comprises a pair of electrodes disposed on a straight line in the first direction in the XY plane, and symmetrical about a straight line in a second direction in the XY plane that is perpendicular to the first direction.

3. A capacitance type sensor comprising:
a substrate that defines thereon an XY plane;
a detective member opposed to the substrate;
a conductive member disposed between the substrate and the detective member so as to be displaceable together with the detective member along a Z-axis perpendicular to the substrate;
an X-axial electrode formed on an X-axis on the substrate so as to cooperate with the conductive member to form a first capacitance element;
a Y-axial electrode formed on a Y-axis on the substrate so as to cooperate with the conductive member to form a second capacitance element;
a Z-axial electrode formed at an origin on the substrate so as to cooperate with the conductive member to form a third capacitance element;
a common electrode formed on the substrate, electrically connected to the conductive member, and kept at a ground potential or another fixed potential; and
a plurality of switch electrodes formed on the substrate so as to be distant from the conductive member, and kept at a potential different from the ground potential,
the conductive member being able to be displaced toward the first to third capacitance electrodes and come into contact with at least one of the plurality of switch electrodes when the detective member is displaced,
the sensor being able to detect displacement of a portion of the detective member corresponding to an X-axial direction on the basis of detection of a change in capacitance value of the first capacitance element caused by a change in distance between the conductive member and the X-axial electrode, by using only a signal being input to the X-axial electrode, and to detect displacement of a portion of the detective member corresponding to a Y-axial direction on the basis of detection of a change in capacitance value of the second capacitance element caused by a change in distance between the conductive member and the Y-axial electrode, by using only a signal being input to the Y-axial electrode, when the conductive member is distant from at least one of the plurality of switch electrodes, and the sensor being able to detect displacement of a portion of the detective member corresponding to a Z-axial direction on the basis of detection of a change in capacitance value of the third capacitance element caused by a change in distance between the conductive member and the Z-axial electrode, by using only a signal being input to the Z-axial electrode, when the conductive member is in contact with all of the plurality of switch electrodes.

4. The sensor according to claim 3, comprising:
a pair of X-axial electrodes disposed so as to be X-axially distant from each other and symmetrical with respect to the Y-axis; and
a pair of Y-axial electrodes disposed so as to be Y-axially distant from each other and symmetrical with respect to the X-axis.

5. A capacitance type sensor comprising:
a substrate that defines thereon an XY plane;
a detective member opposed to the substrate;
a conductive member disposed between the substrate and the detective member so as to be displaceable together with the detective member along a Z-axis perpendicular to the substrate;
an X-axial electrode formed on an X-axis on the substrate so as to cooperate with the conductive member to form a first capacitance element;
a Y-axial electrode formed on a Y-axis on the substrate so as to cooperate with the conductive member to form a second capacitance element;
a Z-axial electrode formed at an origin on the substrate so as to cooperate with the conductive member to form a third capacitance element;
a common electrode formed on the substrate, electrically connected to the conductive member, and kept at a ground potential or another fixed potential; and
a plurality of switch electrodes formed on the substrate so as to be distant from the conductive member, and kept at a potential different from the ground potential,
the conductive member being able to be displaced toward the first to third capacitance electrodes and come into contact with at least one of the plurality of switch electrodes when the detective member is displaced,
the sensor being able to detect displacement of a portion of the detective member corresponding to an X-axial direction on the basis of detection of a change in capacitance value of the first capacitance element caused by a change in distance between the conductive member and the X-axial electrode, by using only a signal being input to the X-axial electrode, and to detect displacement of a portion of the detective member corresponding to a Y-axial direction on the basis of detection of a change in capacitance value of the second capacitance element caused by a change in distance between the conductive member and the Y-axial electrode, by using only a signal being input to the Y-axial electrode, when the conductive member is distant from any of the plurality of switch electrodes, and the sensor being able to detect displacement of a portion of the detective member corresponding to a Z-axial direction on the basis of detection of a change in capacitance value of the third capacitance element caused by a change in distance between the conductive member and the Z-axial electrode, by using only a signal being input to the Z-axial electrode, when the conductive member is in contact with at least one of the plurality of switch electrodes.

6. The sensor according to claim 5, comprising:

a pair of X-axial electrodes disposed so as to be X-axially distant from each other and symmetrical with respect to the Y-axis; and a pair of Y-axial electrodes disposed so as to be Y-axially distant from each other and symmetrical with respect to the X-axis.

7. A capacitance type sensor comprising:

a substrate that defines thereon an XY plane;

a detective member opposed to the substrate;

a conductive member disposed between the substrate and the detective member so as to be displaceable together with the detective member along a Z-axis that is perpendicular to the substrate;

a first capacitance electrode formed on the substrate so as to cooperate with the conductive member to form a first capacitance element;

a second capacitance electrode formed on the substrate so as to cooperate with the conductive member to form a second capacitance element;

a common electrode formed on the substrate, electrically connected to the conductive member, and kept at a ground potential or another fixed potential; and a plurality of switch electrodes formed on the substrate so as to be distant from the conductive member, and kept at a potential different from the ground potential, the conductive member being able to be displaced toward the first and second capacitance electrodes and come into contact with at least one of the plurality of switch electrodes when the detective member is displaced, the sensor being able to detect displacement of a portion of the detective member corresponding to a first direction in the XY plane on the basis of detection of a change in capacitance value of the first capacitance element caused by a change in distance between the conductive member and the first capacitance electrode, by using only a signal being input to the first capacitance electrode, when the conductive member is distant from any of the plurality of switch electrodes, and the sensor being able to detect displacement of a portion of the detective member corresponding to a direction on the Z-axis on the basis of detection of a change in capacitance value of the second capacitance element caused by a change in distance between the conductive member and the second capacitance electrode, by using only a signal being input to the second capacitance electrode, when the conductive member is in contact with at least one of the plurality of switch electrodes.

8. The sensor according to claim 4, wherein the first capacitance electrode comprises a pair of electrodes disposed on a straight line in the first direction in the XY plane, and symmetrical about a straight line in a second direction in the XY plane that is perpendicular to the first direction.

* * * * *

UNITED STATES PATENT AND TRADEMARK OFFICE
CERTIFICATE OF CORRECTION

| | |
|---|---|
| PATENT NO. | : 7,372,281 B2 |
| APPLICATION NO. | : 11/436364 |
| DATED | : May 13, 2008 |
| INVENTOR(S) | : Hideo Morimoto |

Page 1 of 1

It is certified that error appears in the above-identified patent and that said Letters Patent is hereby corrected as shown below:

In the Claims:

In Claim 8, column 16, line 21, the words, "claim 4" should be --claim 7--.

Signed and Sealed this

Thirtieth Day of September, 2008

JON W. DUDAS
*Director of the United States Patent and Trademark Office*